(12) United States Patent
Mi et al.

(10) Patent No.: US 6,906,849 B1
(45) Date of Patent: Jun. 14, 2005

(54) MICRO-MIRROR ELEMENT

(75) Inventors: Xiaoyu Mi, Kawasaki (JP); Hiromitsu Soneda, Kawasaki (JP); Satoshi Ueda, Kawasaki (JP); Ippei Sawaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/711,516

(22) Filed: Sep. 23, 2004

(30) Foreign Application Priority Data

May 14, 2004 (JP) ........................................ 2004-144552

(51) Int. Cl.[7] ........................ G02B 26/00; G02B 26/08; G02B 7/182; G01C 19/00; H01L 29/84
(52) U.S. Cl. ...................... 359/291; 359/214; 359/223; 359/224; 359/230; 359/877; 73/504.02; 73/504.04; 73/504.12; 73/504.14; 257/415
(58) Field of Search ................................ 359/290, 291, 359/214, 222, 223, 224, 230, 877; 73/504.02, 504.04, 504.12, 504.14, 504.09, 514.17; 257/415, 418, 420

(56) References Cited

U.S. PATENT DOCUMENTS

| | | | | |
|---|---|---|---|---|
| 5,488,862 | A | * | 2/1996 | Neukermans et al. ..... 73/504.02 |
| 6,585,379 | B2 | * | 7/2003 | Yokoyama et al. ............ 353/31 |
| 6,761,068 | B1 | * | 7/2004 | Schmid .................... 73/504.14 |
| 6,789,423 | B2 | * | 9/2004 | An et al. .................. 73/504.04 |
| 6,806,992 | B2 | * | 10/2004 | Soneda et al. .............. 359/291 |
| 6,809,529 | B2 | * | 10/2004 | Okada et al. ................ 324/681 |
| 6,817,725 | B2 | * | 11/2004 | Mizuno et al. ............. 359/877 |
| 6,845,666 | B2 | * | 1/2005 | Mochida ................... 73/504.12 |
| 6,845,668 | B2 | * | 1/2005 | Kim et al. ................ 73/504.14 |
| 6,845,669 | B2 | * | 1/2005 | Acar et al. ................ 73/504.14 |
| 2003/0218793 | A1 | | 11/2003 | Soneda et al. .............. 359/291 |

FOREIGN PATENT DOCUMENTS

| | | |
|---|---|---|
| JP | 2003-344785 | 12/2003 |
| WO | WO 00/20899 | 4/2000 |

OTHER PUBLICATIONS

D.T. Neilson et al. "Fully Provisioned 112×112 Micro–Mechanical Optical Crossconnect with 35.8 Tb/s Demonstrated Capacity"; Proc. 25th Optical Fiber Communication Conf.; Baltimore (2000); PD12.

* cited by examiner

*Primary Examiner*—Loha Ben
(74) *Attorney, Agent, or Firm*—Armstrong, Kratz, Quintos, Hanson & Brooks, LLP (57) ABSTRACT

A micro-mirror element includes a micro-mirror substrate, a wiring substrate and an electroconductive spacer disposed between the two substrates. The micro-mirror substrate is formed integral with a frame, a moving portion having a mirror portion, and a torsion bar connecting the frame to the moving portion. The wiring substrate is provided with a wiring pattern. The electroconductive spacer separates the micro-mirror substrate from the wiring substrate and also electrically connects the frame to the wiring pattern. The wiring substrate has a surface that faces the micro-mirror substrate. A detector is provided on this surface for detecting the pivot angle of the mirror portion.

10 Claims, 9 Drawing Sheets

MICRO-MIRROR ELEMENT

BACKGROUND OF THE INVENTION

1. Field of the Invention

The present invention relates to a micro-mirror element to be incorporated in e.g. an optical switching device which switches optical paths between a plurality of optical fibers by changing the direction of light reflection.

2. Description of the Related Art

In recent years, optical communications technology is utilized widely in a variety of fields. In the optical communications, optical fibers serve as a medium through which optical signals are passed. For switching the optical signal passing through a given optical fiber to another fiber, so-called optical switching devices are often used. In order to achieve high quality optical communications, the optical switching device needs to have such characteristics as high capacity, high speed and high reliability in switching action. In view of these, micro-mirror elements manufactured by utilizing a micro-machining technology are attracting attention as a switching element to be incorporated in the optical switching device. The micro-mirror elements enable the switching operation without converting optical signals into electric signals between the optical paths on the input side and the output side of the optical switching device. This is advantageous in achieving the characteristics mentioned above.

An example of the optical switching device using the micro-mirror element manufactured by utilizing the micro-machining technology is disclosed in, for example, International Publication WO 00/20899 and a thesis "Fully Provisioned 112×112 Micro-Mechanical Optical Crossconnect with 35.8 Tb/sec Demonstrated Capacity (Proc. 25th Optical Fiber Communication Conf. Baltimore. PD12(2000))".

Figure 10:
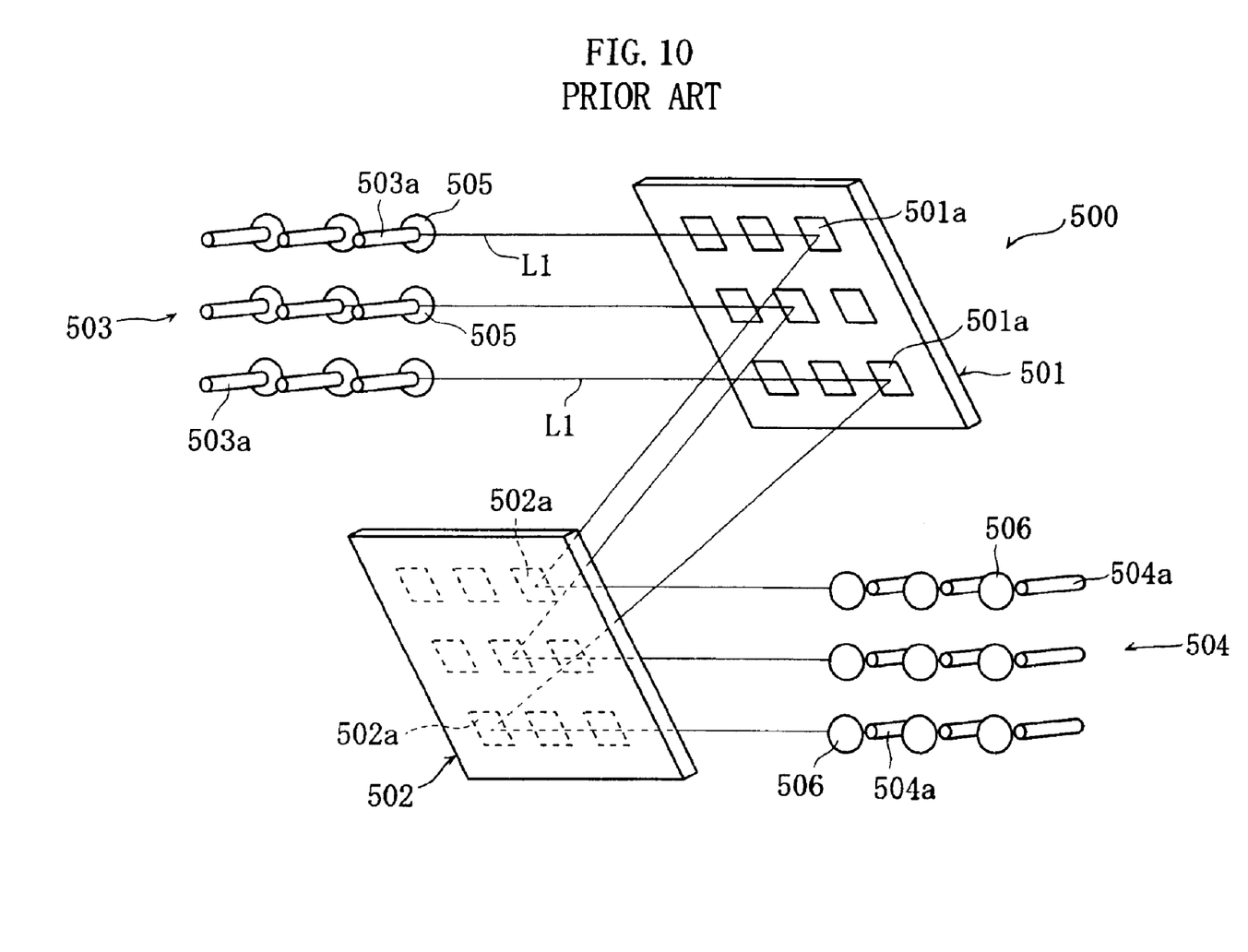
FIG. 10 illustrates a conventional optical switching device.

FIG. 10 outlines a common optical switching device 500. The optical switching device 500 includes a pair of micro-mirror arrays 501, 502, an input fiber array 503, an output fiber array 504, and a plurality of micro lenses 505, 506. The input fiber array 503 includes a predetermined number of input fibers 503a. The micro-mirror array 501 is provided with the same plurality of micro-mirror elements 501a each corresponding to one of the input fibers 503a. Likewise, the output fiber array 504 includes a predetermined number of input fibers 504a. The micro-mirror array 502 is provided with the same plurality of micro-mirror elements 502a each corresponding to one of the output fibers 504a. Each of the micro-mirror elements 501a, 502a has a mirror surface for reflection of light. The orientation of the mirror surface is controllable. Each of the micro lenses 505 faces an end of a corresponding input fiber 503a. Likewise, each of the micro lenses 506 faces an end of a corresponding output fiber 504a.

In transmitting optical signals, light L1 coming out of the output fibers 503a passes through one of the corresponding micro lenses 505, thereby becoming parallel to each other and proceeding to the micro-mirror array 501. The light L1 reflects on their corresponding micro-mirror elements 501a, to be directed toward the micro-mirror array 502. The mirror surfaces of the micro-mirror elements 501a are oriented, in advance, in predetermined directions so as to direct the light L1 to enter their micro-mirror elements 502a. Then, the light L1 is reflected on the micro-mirror elements 502a, and thereby being directed toward the output fiber array 504. The mirror surfaces of the micro-mirror elements 502a are oriented, in advance, in predetermined directions so as to direct the light L1 into their output fibers 504a.

As described, according to the optical switching device 500, the light L1 coming out of the input fibers 503a reaches the desired output fibers 504a due to the deflection by the micro-mirror arrays 501, 502. A given input fiber 503a is connected to an output fiber 504a in a one-to-one relationship. With this arrangement, by appropriately changing the reflection angle of the micro-mirror elements 501a, 502a, switching can be performed and the light L1 can be directed into a selected output fiber 504a.

In the optical switching device 500 described above, the number of fibers increases as the size of optical communications network increases, and accordingly the number of the micro-mirror elements or the number of micro-mirror surfaces also increases. The increase in the number of mirror surfaces leads to an increase in the amount of wiring necessary for driving the mirror surfaces, and thus, an increasing area need be provided for the wiring per micro-mirror array. If the mirror surfaces and the wiring are formed in the same substrate, a pitch or an interval between the mirror surfaces should be increased accordingly to the increase in the area formed with the wiring. This poses a problem of increased size of the substrate or the micro-mirror array. In addition, increase in the number of mirror surfaces itself tends to increase difficulty of forming the mirror surfaces and the wiring in the same substrate.

In order to solve these problems, a micro-mirror element is proposed, in which a pivotable mirror surface and a wiring pattern for driving the mirror surface are formed in separate substrates. These substrates are connected to each other by an electroconductive spacer. (See JP-A-2003-344785, for example.) According to such an arrangement, the wiring pattern for driving the mirror surface is formed in a separate substrate from the one for forming the mirror surfaces. Therefore, it is possible to overcome the problem of increased pitch between the mirror surfaces. Accordingly, it is possible to prevent the micro-mirror elements from becoming unduly large.

When the number of fibers increases due to growth of optical communications network, the number of possible combinations of one-to-one connection between the fibers will increase. As the combination number increases, highly accurate control of the mirror surface direction is required. To this end, it is necessary to properly detect the operating states of the respective mirror surfaces.

SUMMARY OF THE INVENTION

The present invention has been proposed under the circumstances described above. It is therefore an object of the present invention to provide micro-mirror elements which are compact and capable of properly detecting the operating states of the respective mirror surfaces.

According to the present invention, there is provided a micro-mirror element comprising: a micro-mirror substrate formed integral with at least one micro-mirror unit that includes a frame, a moving portion having a mirror portion, and a torsion bar connecting the frame to the moving portion; a wiring substrate formed with a wiring pattern; and an electroconductive spacer for separating the micro-mirror substrate from the wiring substrate and for electrically connecting the frame to the wiring pattern. The wiring substrate includes a first surface facing the micro-mirror substrate, and the first surface is provided with a detector for detecting the pivot angle of the mirror portion.

Preferably, the micro-mirror substrate may be formed integral with a plurality of micro-mirror units each of which includes a frame, a moving portion having a mirror portion, and a torsion bar connecting the frame to the moving portion. Further, the first surface of the wiring substrate may be provided with a plurality of detectors corresponding to the plurality of micro-mirror units, respectively. Each detector detects the pivot angle of the mirror portion in a corresponding one of the micro-mirror units.

Preferably, the detector may comprise an optical sensor or a capacitance-type sensor, for example.

Preferably, the wiring substrate may include a second surface opposite to the first surface. The wiring pattern may include a first wiring portion formed on the first surface and a second wiring portion formed on the second surface. The wiring substrate may be formed with tie connectors penetrating the wiring substrate in the thickness direction for connecting the first wiring portion and the second wiring portion to each other.

Preferably, the tie connectors may be made of an electroconductive material selected from a group of metals, semiconductors and electroconductive organic materials.

Preferably, the tie connectors may be made by one of plating, CVD, LPCVD and MOCVD.

Preferably, the spacer may comprise at least one electroconductive bump. Specifically, the spacer may comprise only one electroconductive bump, or a plurality of bumps stacked upon each other.

Preferably, the electroconductive spacer may be connected to the wiring pattern and/or the frame via an electrode pad, an electroconductive adhesive, and so on.

DETAILED DESCRIPTION OF THE PREFERRED EMBODIMENTS

Preferred embodiments of the present invention will be described below with reference to the accompanying drawings.

Figure 1:
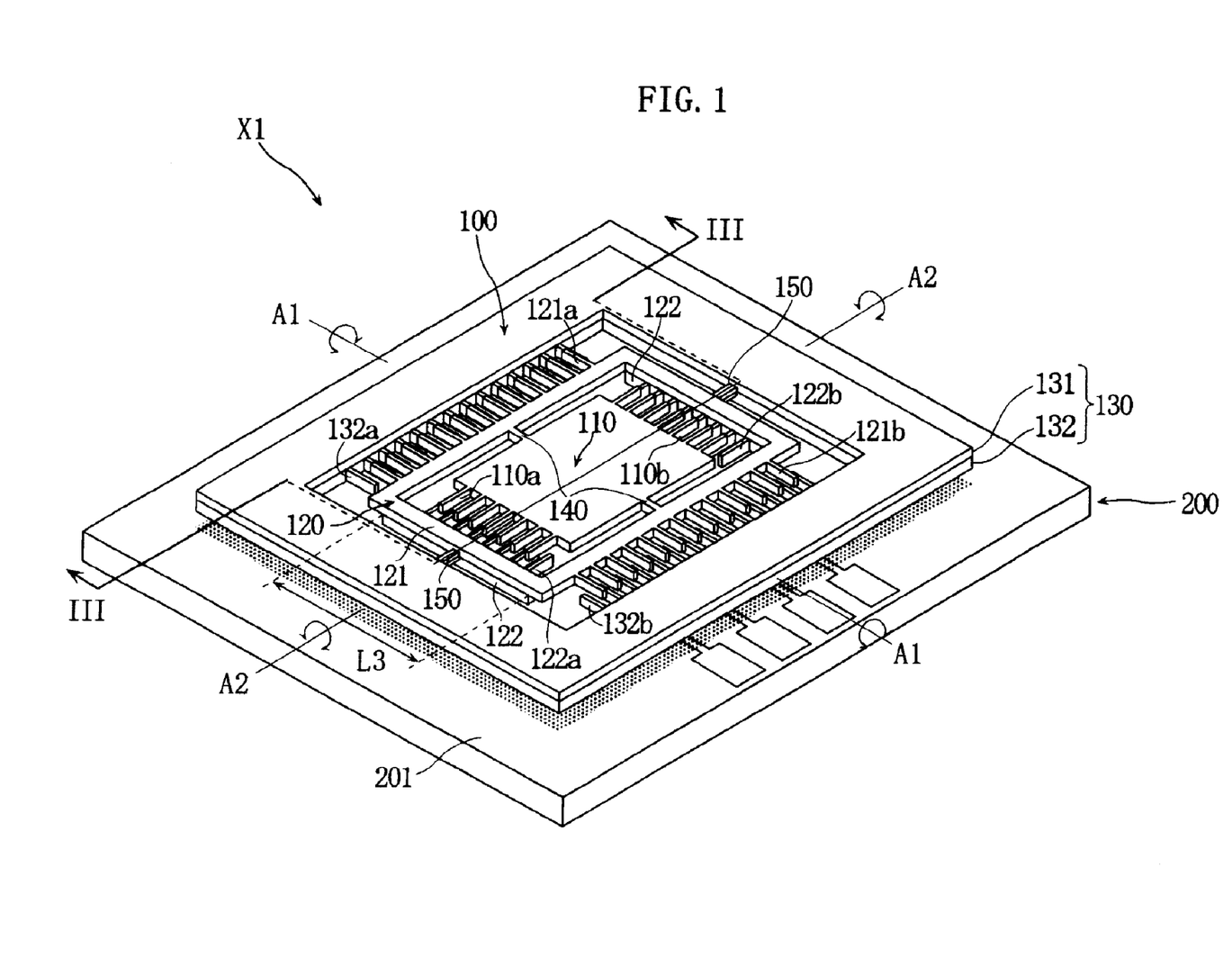
FIG. 1 is a perspective view showing a micro-mirror element according to a first embodiment of the present invention.
Figure 2:
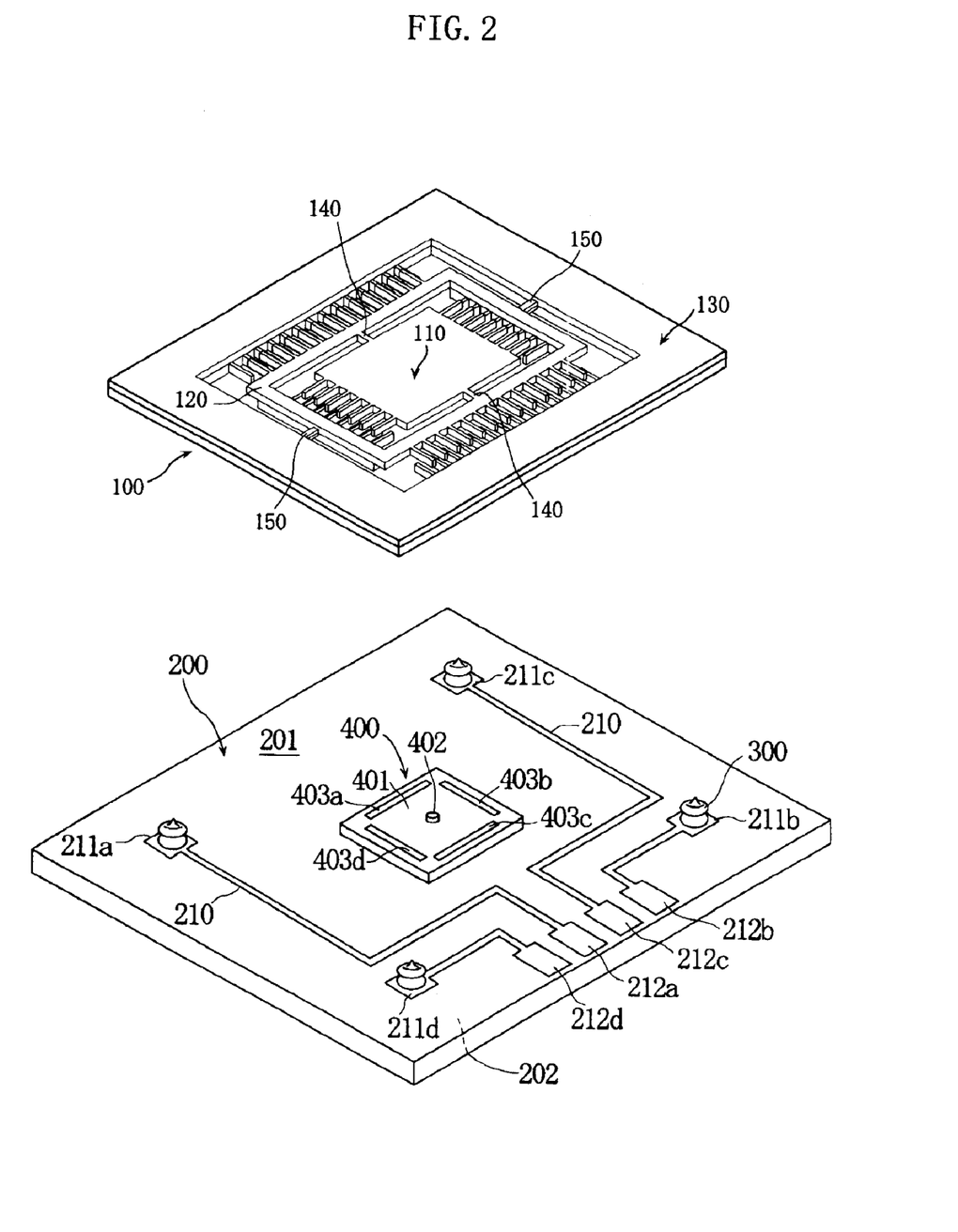
FIG. 2 is an exploded perspective view of the micro-mirror element shown in FIG. 1.
Figure 3:
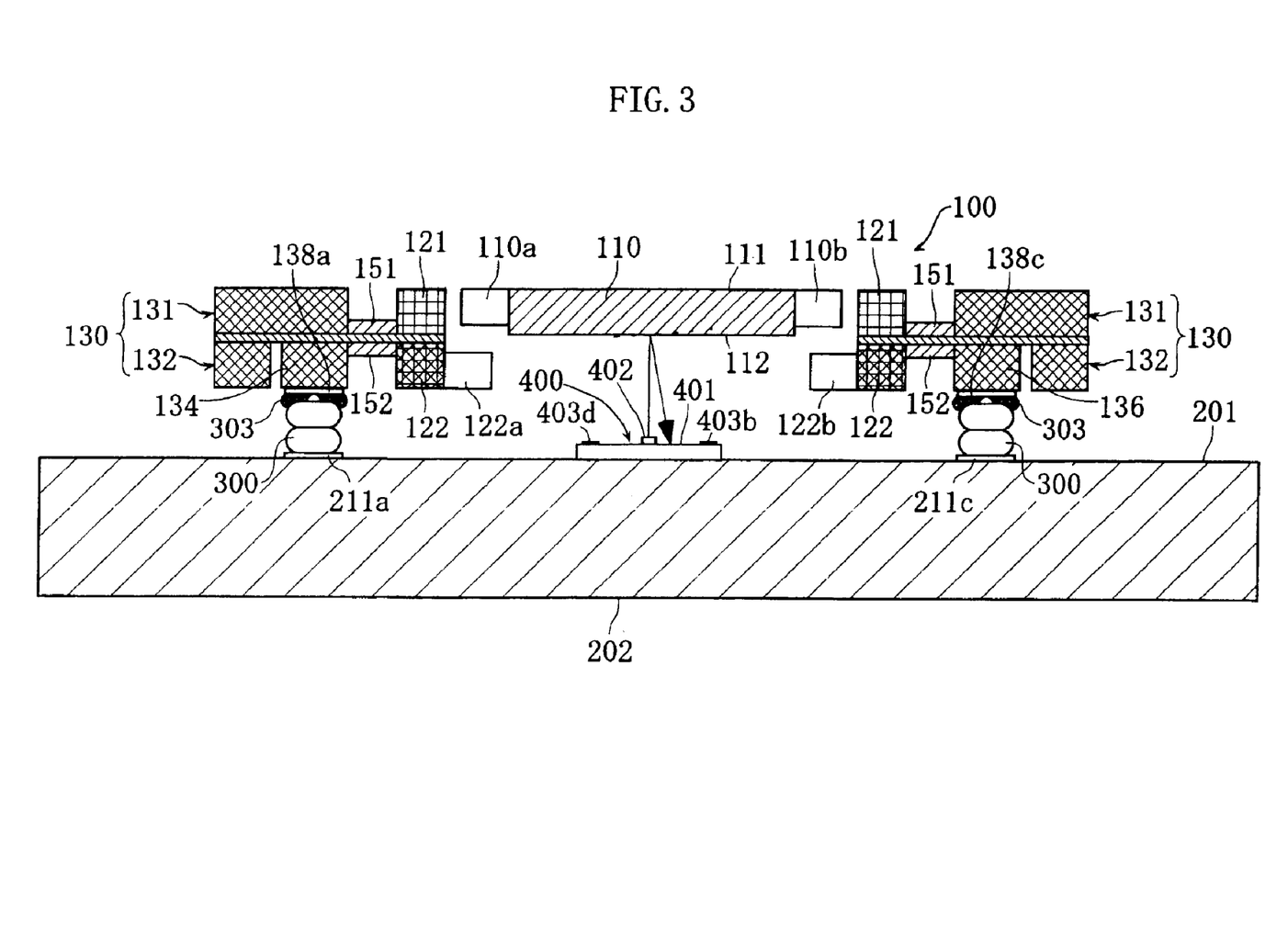
FIG. 3 is a sectional view taken along lines III—III in FIG. 1.

FIG. 1 is a perspective view showing a micro-mirror element X1 according to a first embodiment of the present invention. FIG. 2 is an exploded perspective view of the micro-mirror element X1 in FIG. 1. FIG. 3 is a sectional view taken along lines III—III in FIG. 1.

The micro-mirror element X1 includes a micro-mirror substrate 100, a wiring substrate 200, electroconductive spacers 300 disposed between the two substrates, and an optical sensor unit 400. The micro-mirror substrate 100 has a mirror-formed portion 110, an inner frame 120 surrounding the portion 110, an outer frame 130 surrounding the inner frame 120, a pair of torsion bars 140 connecting the mirror-formed portion 110 to the inner frame 120, and a pair of torsion bars 150 connecting the inner frame 120 to the outer frame 130. The torsion bars 140 define a pivotal axis A1 for the mirror-formed portion 110 to pivot with respect to the inner frame 120. The torsion bars 150 define a pivotal axis A2 for the inner frame 120 and the mirror-formed portion 110, to pivot with respect to the outer frame 130. The pivotal axis A1 and the pivotal axis A2 are generally perpendicular to each other. Thus, the micro-mirror substrate 100 is formed with a biaxial micro-mirror.

The micro-mirror substrate 100 of the present embodiment is formed by utilizing a micro-machining technology, from an SOI (Silicon on Insulator) wafer having a layered structure which includes a first silicon layer (having e.g. a 100 μm thickness), a second silicon layer (having e.g. a 100 μm thickness), and an insulating layer (having e.g. a 1 μm thickness) disposed between the two silicon layers. The micro-mirror substrate 100 may be produced by photolithography, dry etching (Deep Reactive Ion Etching or DRIE, for example) and wet etching, which are performed with respect to the first silicon layer, the second silicon layer and the insulating layer. The first silicon layer and the second silicon layer, which are electrically conductive, are doped with an N-type impurity such as P and As, or P-type impurity such as B.

The mirror-formed portion 110 has an upper surface formed with a thin film of mirror surface 111, and a lower surface formed with a thin film of reflection surface 112 for reflecting light from the optical sensor unit. The mirror-formed portion 110 has two side surfaces facing away from each other and formed with comb-like electrodes 110a and 110b. The mirror-formed portion 110 is derived from the first silicon layer.

The inner frame 120 has a layered structure including an inner frame main portion 121, a pair of electrode bases 122, and an insulating layer between them. The inner frame main portion 121 and the electrode bases 122 are electrically separated from each other by the insulating layer. The electrode bases 122 are formed with inwardly extending comb-like electrodes 122a, 122b respectively. The inner frame main portion 121 has outwardly extending comb-like electrodes 121a, 121b. The comb-like electrodes 122a, 122b are below the comb-like electrodes 110a, 110b of the mirror-formed portion 110, and are positioned so as not to contact with the comb-like electrodes 110a, 110b when the mirror-formed portion 110 pivots. The inner frame main portion 121 is derived from the first silicon layer, whereas the electrode bases 122 are derived from the second silicon layer.

Each of the torsion bars 140, derived from the first silicon layer, is connected to the mirror-formed portion 110 and the inner frame main portion 121.

Figure 4:
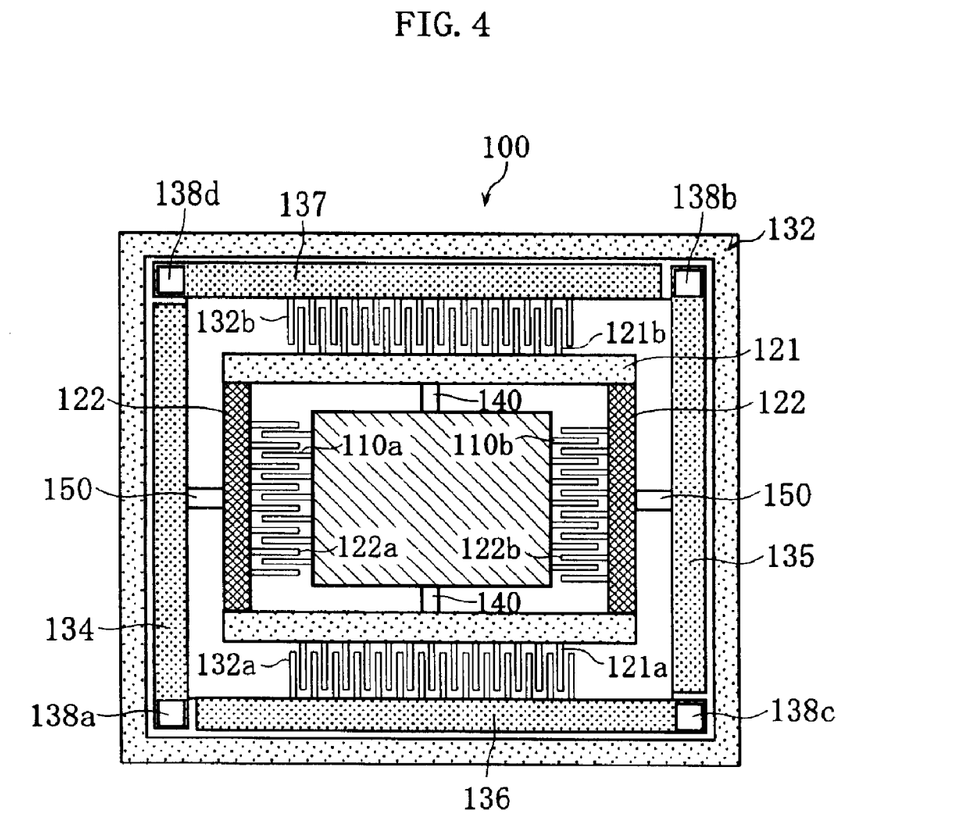
FIG. 4 is a bottom view showing a micro-mirror substrate of the micro-mirror element.

The outer frame 130 has a layered structure including a first outer frame 131, a second outer frame 132 and an insulating layer between them. The first outer frame 131 and the second outer frame 132 are electrically separated from each other by the insulating layer. As shown in FIG. 4, the second outer frame 132 is formed with a first island 134, a second island 135, a third island 136 and a fourth island 137 which are spaced from each other. The first through the fourth islands 134–137 are formed with electrode pads 138a–138d respectively. The electrode pads 138a–138d may be made of Au or Al. The third island 136 and the fourth island 137 have inwardly extending comb-like electrodes 132a, 132b respectively. The comb-like electrodes 132a, 132b are below the comb-like electrodes 121a, 121b of the inner frame main portion 121 respectively, and positioned so as not to contact with the comb-like electrodes 121a, 121b when the inner frame 120 pivots. The first outer frame 131 is derived from the first silicon layer, whereas the second outer frame 132 is derived from the second silicon layer.

Each of the torsion bars 150 has a layered structure including an upper layer 151, a lower layer 152 and an insulating layer between them. The upper layer 151 and the lower layer 152 are electrically separated from each other by the insulating layer. The insulating layer may be provided by a layer of air. The upper layer 151 is connected to the inner frame main portion 121 and the first outer frame 131, whereas the lower layer 152 is connected to the electrode bases 122 and the second outer frame 132. The upper layer 151 is derived from the first silicon layer, whereas the lower layer 152 is derived from the second silicon layer.

The wiring substrate 200 includes a first surface 201 and a second surface 202. The first surface 201 is formed with a predetermined wiring pattern 210. The wiring pattern 210 includes four electrode pads 211a–211d for internal connection, and four electrode pads 212a–212d for external connection. The electrode pads 211a–211d are disposed correspondingly in position to the electrode pads 138a–138d provided on the micro-mirror substrate. The main body of the wiring substrate 200 is provided by a semiconductor substrate of Si or a glass substrate, having a thickness of e.g. 300 µm. The first surface 201 of the wiring substrate 200 is mechanically polished for flatness. The wiring pattern 210 may be made by forming and then patterning a film of metal on the first surface 201 of the wiring substrate 200. The metal used in this formation may be Au or Al. The film formation may be performed by sputtering or plating, for example.

The conductive spacers 300 are provided between the electrode pads 138a–138d of the micro-mirror substrate and the electrode pads 212a–212d of the wiring substrate. According to the present embodiment, each of the conductive spacers 300 is a stack of two Au bumps, and is fused with corresponding one of the electrode pads 211a–211d while bonded to corresponding one of the electrode pads 138a–138d via an electroconductive adhesive 303. The stacked two Au bumps are connected to each other by ultrasonic bonding. According to the present invention, each of the spacers 300 may comprise only one conductive bump.

The optical sensor unit 400 detects the pivot angle of the mirror-formed portion 110, and is provided on the first surface 201 of the wiring substrate via an adhesive for example. The optical sensor unit 400 is faced to the lower surface of the mirror-formed portion 110. The optical sensor unit 400 uses e.g. a PSD sensor which is capable of detecting positions by means of light. The optical sensor unit 400 includes an upper surface provided with a rectangular light receiver 401. The light receiver 401 has a center portion provided with a light source 402 for lighting the reflecting surface 112 of the mirror-formed portion. The light receiver 401 has a surface provided with four electrodes 403a–403d each being near an edge. The wiring substrate 200 is provided with wirings (not illustrated) in order to supply power to the light source 402, and to pass output currents from the electrodes. The sensor element of the optical sensor may not be a PSD sensor, and may be selected from many alternatives such as a two-dimensional matrix of photodiodes.

In the micro-mirror element X1 having the above-described arrangements, the first outer frame 131 may be grounded. Then, the comb-like electrodes 110a, 110b and the comb-like electrodes 121a, 121b are grounded via the upper layer 151 of the torsion bars 150, the inner frame main portion 121, the torsion bars 140 and the mirror-formed portion 110. In this state, a predetermined electric potential is applied to the comb-like electrode 122a or the comb-like electrode 122b, so that a static electric force is generated between the comb-like electrode 110a and the comb-like electrode 122a, or between the comb-like electrode 110b and the comb-like electrode 122b. As a result, the mirror-formed portion 110 is caused to pivot about the pivotal axis A1. Likewise, a predetermined electric potential is applied to the comb-like electrode 132a or the comb-like electrode 132b, so that a static electric force is generated between the comb-like electrode 121a and the comb-like electrode 132a, or between the comb-like electrode 121b and the comb-like electrode 132b. As a result, the inner frame 120 and the mirror-formed portion 110 are caused to pivot about the pivotal axis A2.

As understood from FIG. 2–FIG. 4, the application of an electric potential to the comb-like electrode 122a is achieved via the electrode pad 212a of the wiring substrate 200, the electrode pad 211a, the conductive spacer 300, the electrode pad 138a of the micro-mirror substrate 100, the first island 134, the lower layer 152 of the torsion bar 150, and the electrode base 122. The application of an electric potential to the comb-like electrode 122b is achieved via the electrode pad 212b of the wiring substrate 200, the electrode pad 211b, the conductive spacer 300, the electrode pad 138b of the micro-mirror substrate 100, the second island 135, the lower layer 152 of the torsion bar 150, and the electrode base 122. The application of an electric potential to the comb-like electrode 132a is achieved via the electrode pad 212c of the wiring substrate 200, the electrode pad 211c, the conductive spacer 300, the electrode pad 138c of the micro-mirror substrate 100, and the third island 136. The application of an electric potential to the comb-like electrode 132b is achieved via the electrode pad 212d of the wiring substrate 200, the electrode pad 211d, the conductive spacer 300, the electrode pad 138d of the micro-mirror substrate 100, and the fourth island 137. By applying the appropriate electric potential via the four paths, it is possible to direct the mirror-formed portion 110 in the required direction.

When the mirror-formed portion 110 or the inner frame 120 is pivoted by the application of electric potentials as described, an end of these movable members shifts in position toward the wiring substrate 200. Specifically, assuming that the length L3 of the electrode bases 122 in the inner frame 120 is 600 µm, the end of the electrode bases 122 will be lowered by 60 µm from the normal non-pivot position when the inner frame 120 pivots by 5 degrees about the axis A2. In order not to interfere with such movement of the inner frame, the micro-mirror substrate 100 and the wiring substrate 200 need to be appropriately spaced from each other. In light of this, the conductive spacer 300 of the present embodiment may have a height of 100 µm, for example.

With the mirror-formed portion 110 caused to face in the desired direction by the application of an electric potential, the pivot angle of the mirror-formed portion 110 is detected by the optical sensor unit 400. Specifically, as shown in FIG. 3, first, light is emitted from the light source 402 of the optical sensor unit to the center of the reflecting surface 112 formed on the lower surface of the mirror-formed portion 110. If the mirror-formed portion 110 is in a slant position as shown by the imaginary line (broken line) in the figure, the light reflected on the surface 112 deviates from the light source 402 in accordance with the pivot angle of the mirror-formed portion, to be received by the light receiver 401. It should be noted here that the pivot angle of the mirror-formed portion 110 is a sum of the pivot angle about the axis A1 and the pivot angle about the axis A2. As the light strikes on a point on the light receiver 401, a current due to the carriers generated by the light flows through the electrodes 403a–403d. Then, a ratio of the current passing through the electrode 403a and the current passing through the opposed electrode 403c is calculated. Likewise, a ratio of the current passing through the electrode 403b and the current passing through the opposed electrode 403d is calculated. Based on these two ratios, it is possible to detect the point where the light hits the light receiver 401. Further, based on the detected point, it is possible to calculate the pivot angle of the mirror-formed portion 110. Thus, when it is found that the mirror-formed portion 110 is not facing in the required direction, the potentials applied to the comb-like electrodes 122a, 122b, 132a and 132b are adjusted (i.e., increased or decreased) for causing the mirror-formed portion 110 to face in the required direction.

With the use of the optical sensor unit 400, it is possible to detect the pivot angle of the mirror-formed portion 110 without contacting the portion 110. In other words, the detection of the pivot angle for the mirror-formed portion 110 does not hinder the operation of the portion 110.

In the micro-mirror element X1, the electroconductive spacers 300 serve as a connector for connecting the conductive path on the micro-mirror substrate 100 to the wiring pattern 210 on the wiring substrate 200, and as a separator for spacing the two substrates 100 and 200 away from each other by an appropriate distance. The optical sensor unit 400 is provided in the space present between the substrates 100 and 200. With such an arrangement, the micro-mirror element X1 can be compact. Further, the optical sensor unit 400 is located near the mirror-formed portion 110. Accordingly, the pivot angle detection for the mirror-formed portion 110 is accurately performed. In addition, the wiring necessary for driving the mirror-formed portion 110 and the inner frame 120 is not formed on the micro-mirror substrate 110, upon which the two portions 110 and 120 are provided. In this manner, the micro-mirror substrate 100 and hence the micro-mirror element X1 can be made compact.

Figure 5:
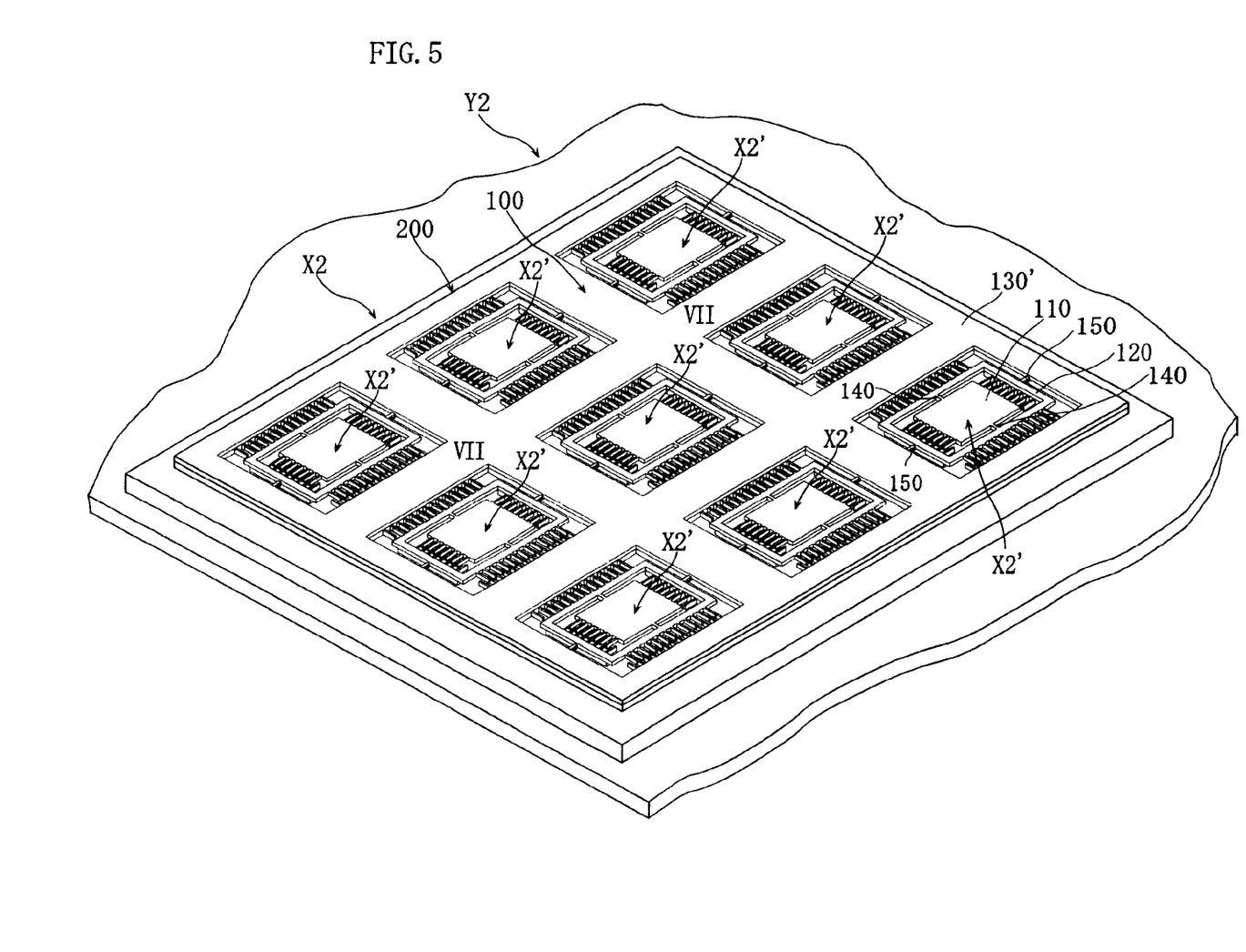
FIG. 5 is a perspective view showing a micro-mirror element according to a second embodiment of the present invention.
Figure 6:
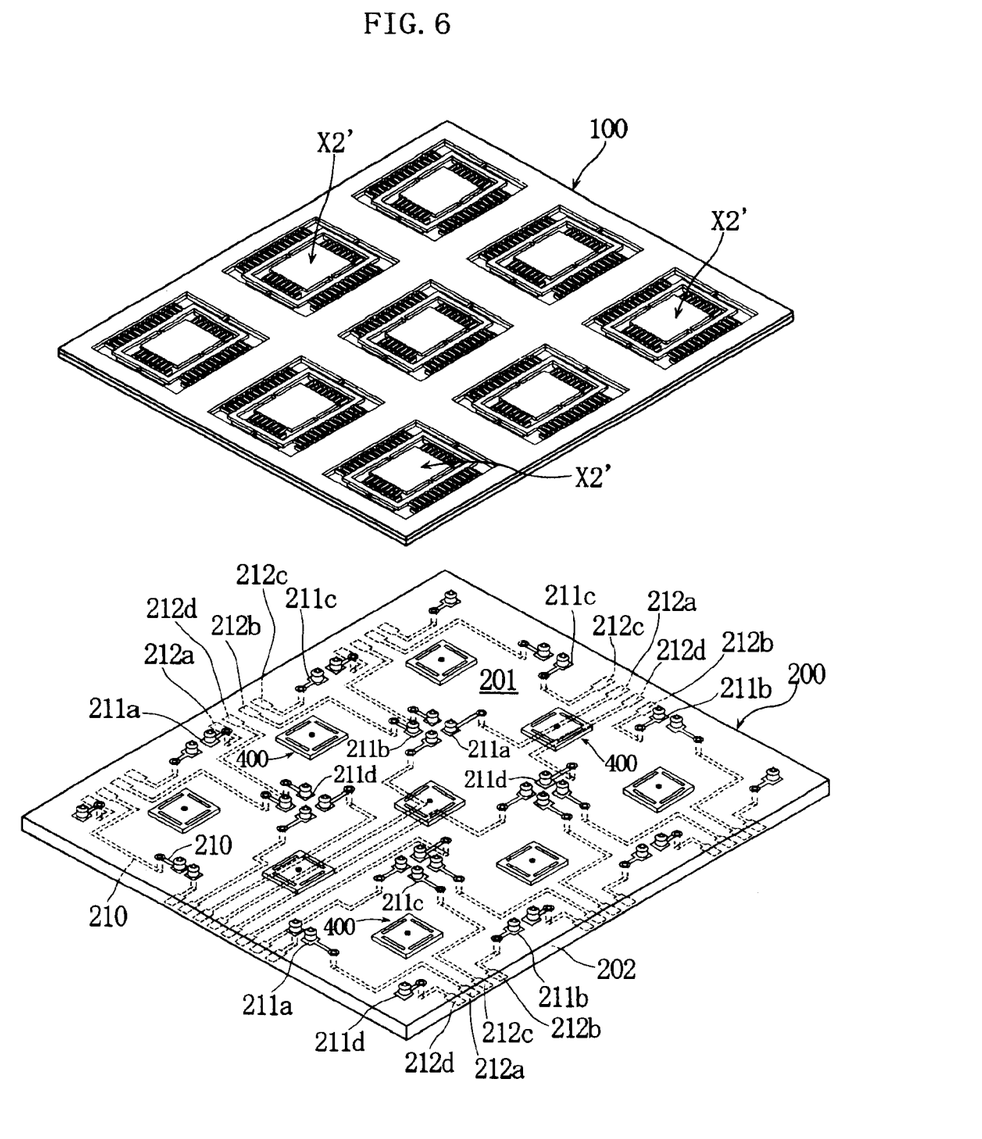
FIG. 6 is an exploded perspective view of the micro-mirror element shown in FIG. 5.
Figure 7:
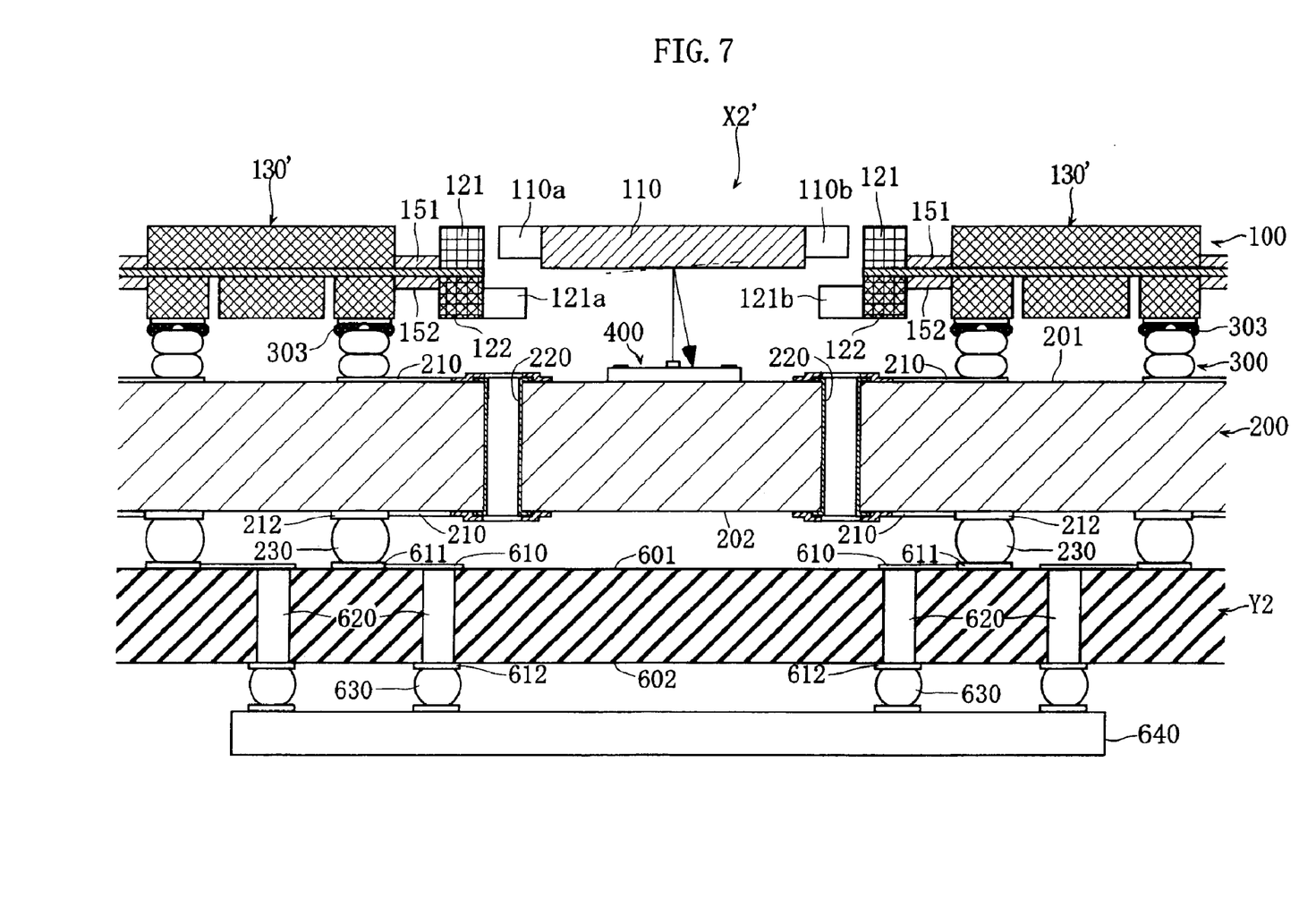
FIG. 7 is a partial sectional view showing the structure of the micro-mirror element of the second embodiment.

FIG. 5 is a perspective view of a micro-mirror element X2 according to a second embodiment of the present invention. FIG. 6 is an exploded perspective view of the micro-mirror element X2. FIG. 7 is a partial sectional view showing the structure of the micro-mirror element X2.

The micro-mirror element X2 of the second embodiment includes a micro-mirror substrate 100, a wiring substrate 200, conductive spacers 300 between the two, and a plurality of optical sensor units 400 (nine units by the illustrated example). The micro-mirror substrate 100 includes a plurality of micro-mirror units X2' (nine units in the illustrated example) and a common outer frame 130' surrounding the units X2'. Each of the micro-mirror units X2' includes a mirror-formed portion 110, an inner frame 120 surrounding the portion 110, a pair of torsion bars 140 connecting the mirror-formed portion 110 and the inner frame 120, and a pair of torsion bars 150 connecting the inner frame 120 and the common outer frame 130'. The mirror-formed portion 110, the inner frame 120, the torsion bars 140 and the torsion bars 150, of the micro-mirror unit X2' are the same as those in the micro-mirror element X1, and the common outer frame 130' of each micro-mirror unit X2' is similar to the outer frame 130 in the micro-mirror element X1. In light of this, the micro-mirror element X1 of the first embodiment can be considered as having one micro-mirror unit, while the element X2 of the second embodiment has more than one micro-mirror unit.

The wiring substrate 200 includes a first surface 201 and a second surface 202. The first surface 201 and the second surface 202 are each formed with a wiring pattern 210 for individually driving the micro-mirror units X2'. For each of the micro-mirror units X2', the wiring pattern 210 in the first surface 201 includes four electrode pads 211a–211d for internal connection, while the wiring pattern 210 in the second surface 202 includes four electrode pads 212a–212d for external connection. In the wiring pattern 210 of the above constitution, the wiring pattern 210 in the first surface and the wiring pattern 210 in the second surface are electrically connected to each other by tie connectors 220 which penetrate the wiring substrate 200. The tie connectors 220 are formed before the wiring patterns 210 are formed. The tie connectors 220 are made by forming through-holes in the wiring substrate 200, and then forming a film of metal (Cu for example) to surround each through-hole on the first surface 201 and on the second surface 202. The formation of the through-holes can be achieved by laser or DRIE. The formation of metal film can be achieved by electroless plating. The electrode pads 212 are formed with e.g. a solder bump for making external connection. All the other aspects of the wiring substrate 200 are the same as of the micro-mirror element X1.

The electroconductive spacers 300 are disposed between the electrode pads 138a–138d of the micro-mirror substrate and the electrode pads 212a–212d of the wiring substrate. All the other aspects of the conductive spacers 300 are the same as of the micro-mirror element X1.

The optical sensor units 400 are attached to the first surface 201 of the wiring substrate via an adhesive for example. The optical sensor units 400 may be provided in the first surface 201 of the wiring substrate. Each optical sensor unit 400 is caused to face the lower surface of the mirror-formed portion 110 of the corresponding micro-mirror unit X2'. All the other aspects of the optical sensor unit 400 are the same as of the micro-mirror element X1.

The micro-mirror element X2 is provided on a mother substrate Y2 made of e.g. a ceramic or a glass epoxy resin. In addition to the micro-mirror element X2, the mother substrate Y2 carries circuit-constituting parts such as ICs (not shown in the figures). The mother substrate Y2 has a first surface 601 formed with a wiring pattern 610 and electrode pads 611. The solder bumps 230 are connected to the electrode pads 611. The mother substrate has a second surface 602 formed with electrode pads 612. The wiring pattern 610 on the first surface and the electrode pads 612 on the second surface are electrically connected by tie connectors 620 penetrating the mother substrate Y2. The second surface 602 of the mother substrate Y2 is connected to a connector 640 via solder bumps 630 for example. In this arrangement, the wiring substrate 200 serves as a relay substrate between the mother substrate Y2 and the micro-mirror substrate 100.

According to the second embodiment, as described above, nine micro-mirror elements (each corresponding to the element X1 of the first embodiment) are formed integral with each other in the micro-mirror substrate 100 and the wiring substrate 200, and they are capable of functioning in the same manner as described for the micro-mirror element X1. Further, since nine optical sensor units 400 are provided on the wiring substrate 200 for the respective nine micro-mirror elements, the pivot angle of each mirror element can be accurately detected.

The micro-mirror element X2 includes arrangements to enable size reduction and accurate detection of the operating condition for each mirror-formed portion 110. In the element X2, use is made of electroconductive spacers 300 which serve as a connector for connecting the conductive paths'on the micro-mirror substrate 100 to the wiring pattern 210 on the wiring substrate 200, and as a separator for spacing the two substrates 100 and 200 away from each other by an appropriate distance. The respective optical sensor units 400 are provided in the space present between the substrates 100 and 200. In this manner, the sensor units 400 do not lead to increase in size of the micro-mirror element X2. Further, each of the sensor units 400 is disposed near the corresponding one of the mirror-formed portions 110. Accordingly, highly accurate detection of the pivot angle can be performed. Still further, the micro-mirror substrate 100 is not provided with the wiring for driving the movable members (i.e., the mirror-formed portion 110 and the inner frame 120). Thus, size reduction is possible for the micro-mirror substrate 100 and hence the micro-mirror element X2. In addition, since the wiring pattern 210 is also provided on the second surface 202 of the wiring substrate, a sufficiently large area can be ensured for forming the wiring pattern 210 even though the sensor units 400 are provided on the first surface 201 of the wiring substrate. In the illustrated example, nine micro-mirror units X2' are formed in the micro-mirror substrate 100, though the present invention is not limited to this particular number.

Figure 8:
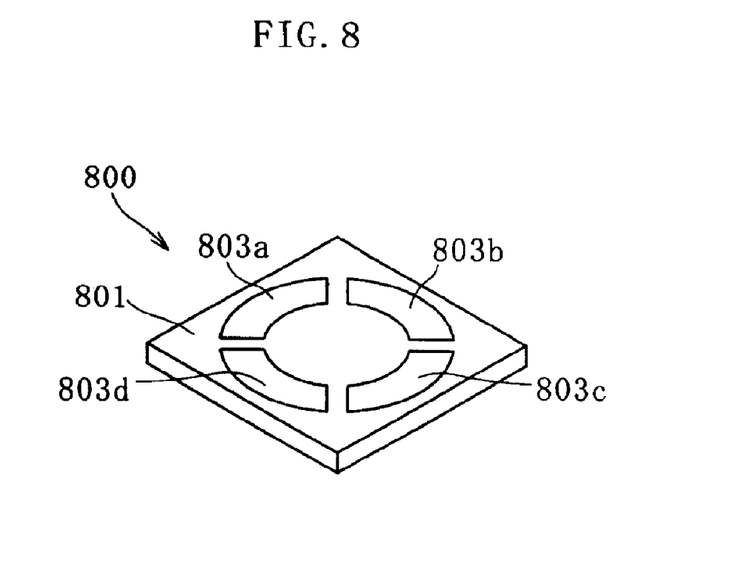
FIG. 8 is a perspective view showing an example of a detector.

According to the first and the second embodiments, the pivot angle of the mirror-formed portion 110 is detected by an optical sensor. Alternatively, use may be made of a capacitance-type sensor. Specifically, as shown in FIG. 8, a capacitance-type sensor 800 may be made by using four electrodes 803a–803d disposed on a substrate 801, so that the electrodes face the lower surface of the mirror-formed portion 110. Each of the electrodes 803a–803d is located at a position corresponding to one of the four ends of the rectangular mirror-formed portion 110. Thus, when the mirror-formed portion 110 is caused to pivot about the axis A1 or axis A2, one of the four ends of the mirror-formed portion 110 is brought closer to the corresponding one of the four electrodes 803a–803d. In this perspective, the mirror-formed portion 110 serves as a movable electrode which provides a capacitor in relation to any one of the electrodes 803a–803d. Since four electrodes 803a–803dare provided (and the mirror-formed portion 110 has four ends corresponding to the electrodes, respectively), a total of four capacitors are present between the portion 110 and the electrodes. The capacitance of each capacitor is variable depending on the pivotal condition of the mirror-formed portion 110 about the axis A1 and the axis A2. Thus, the pivot angle of the portion 110 can be calculated by detecting the increase or decrease in capacitance of the four capacitors.

According to the first and the second embodiments, the wiring pattern 210 is formed directly on the wiring substrate 200. Alternatively, the wiring pattern 210 may be formed on an intermediate layer such as an insulating film to be formed on the wiring substrate 200.

Figure 9:
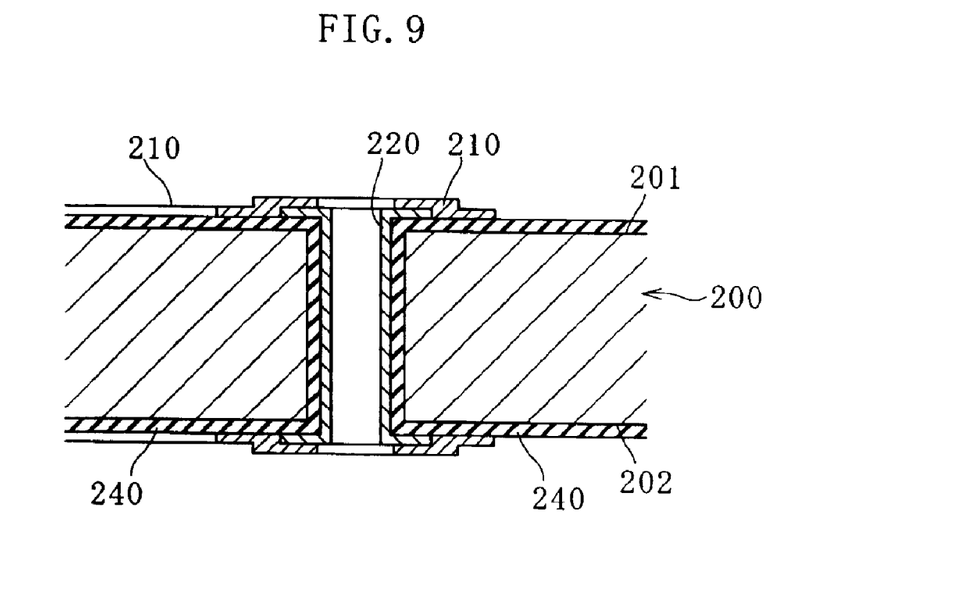
FIG. 9 is a partial sectional view showing an example of a wiring substrate.

Referring back to FIG. 7, a tie connector 220 is formed directly on the wiring substrate 200, though the present invention is not limited to this. For instance, as shown in FIG. 9, the wiring substrate 200 may be coated with an insulating film 240 made of $SiO_2$, for example, and then tie connectors 220 and a wiring pattern 210 may be formed on the insulating film 240. The insulating film 240 may be made by CVD (chemical vapor deposition), for example. With such an arrangement, reliable insulation is ensured between the wiring substrate 200 and the wiring pattern 210 or tie connector 220 even when the wiring substrate 200 is made of a semiconductor (Si, for example). As a result, it is possible to prevent a current from leaking to the wiring substrate 200.

In the second embodiment, the tie connectors are made from a metal material such as Cu. Alternatively, they may be made of a semiconductor material (e.g. silicon doped with an N-type or P-type impurity for electric conductivity) or electroconductive organic material (e.g. resin paste containing particles of metal such as silver or gold). The tie connectors may be produced by various processes depending on the material of the tie connectors. Examples of such processes are CVD, LPCVb (low pressure CVD), and MOCVD (metal-organic CVD). The tie connectors may also be formed by completely filling a through-hole with an electroconductive material.

What is claimed is:

1. A micro-mirror element comprising:
   a micro-mirror substrate formed integral with at least one micro-mirror unit that includes a frame, a moving portion having a mirror portion, and a torsion bar connecting the frame to the moving portion;
   a wiring substrate formed with a wiring pattern; and
   an electroconductive spacer for separating the micro-mirror substrate from the wiring substrate and for electrically connecting the frame to the wiring pattern;
   wherein the wiring substrate includes a first surface facing the micro-mirror substrate, the first surface being provided with a detector for detecting a pivot angle of the mirror portion.

2. The micro-mirror element according to claim 1, wherein the micro-mirror substrate is formed integral with a plurality of micro-mirror units each of which includes a frame, a moving portion having a mirror portion, and a torsion bar connecting the frame to the moving portion, and
   wherein the first surface of the wiring substrate is provided with a plurality of detectors corresponding to the plurality of micro-mirror units, respectively, each detector detecting a pivot angle of the mirror portion in a corresponding one of the micro-mirror units.

3. The micro-mirror element according to claim 1, wherein the detector comprises an optical sensor.

4. The micro-mirror element according to claim 1, wherein the detector comprises a capacitance-type sensor.

5. The micro-mirror element according to claim 1, wherein the wiring substrate includes a second surface opposite to the first surface, the wiring pattern including a first wiring portion on the first surface and a second wiring portion on the second surface, the wiring substrate being formed with tie connectors penetrating the wiring substrate in the thickness direction for connecting the first wiring portion and the second wiring portion to each other.

6. The micro-mirror element according to claim 5, wherein the tie connectors are made of an electroconductive material selected from a group of metals, semiconductors and electroconductive organic materials.

7. The micro-mirror element according to claim 5, wherein the tie connectors are made by one of plating, CVD, LPCVD and MOCVD.

8. The micro-mirror element according to claim 1, wherein the spacer comprises at least one electroconductive bump.

9. The micro-mirror element according to claim 1, wherein the electroconductive spacer is connected to at least one of the wiring pattern and the frame via an electrode pad.

10. The micro-mirror element according to claim 1, wherein the electroconductive spacer is connected to at least one of the wiring pattern and the frame via an electroconductive adhesive.

* * * * *